United States Patent
Jung

[19]

[11] Patent Number: 5,932,916
[45] Date of Patent: Aug. 3, 1999

[54] ELECTROSTATIC DISCHARGE PROTECTION CIRCUIT

[75] Inventor: Hyuck Chai Jung, Chungcheongbuk-do, Rep. of Korea

[73] Assignee: LG Semicon Co., Ltd., Chungcheongbuk-do, Rep. of Korea

[21] Appl. No.: 09/078,134

[22] Filed: May 14, 1998

[30] Foreign Application Priority Data

Sep. 26, 1997 [KR] Rep. of Korea ...................... 97-49217

[51] Int. Cl.⁶ .................................................. H01L 23/62
[52] U.S. Cl. ........................................... 257/355; 257/316
[58] Field of Search .................................... 257/355–363, 257/314–317

[56] References Cited

U.S. PATENT DOCUMENTS 5,465,189  11/1995  Polgreen et al. ........................ 257/357
5,869,873   2/1999  Yu ............................................ 257/362

*Primary Examiner*—David B. Hardy
*Attorney, Agent, or Firm*—Morgan, Lewis & Bockius LLP

[57] ABSTRACT

The ESD protection circuit disclosed, including: a second conductivity of well formed in a predetermined portion of a first conductivity of semiconductor substrate; a first conductivity of first impurity region and second conductivity of second impurity region, formed in the second conductivity of well; a first gate electrode formed on the semiconductor substrate, and second gate electrode formed on the first gate electrode, the first gate electrode being isolated from the semiconductor substrate; second conductivity of third and fourth impurity regions, formed in a portion of the semiconductor substrate, the portion being placed on both sides of the first and second gate electrodes; and a second conductivity of fifth impurity region formed on the semiconductor substrate, the fourth and fifth impurity regions having an isolation layer therebetween.

7 Claims, 3 Drawing Sheets

ELECTROSTATIC DISCHARGE PROTECTION CIRCUIT

BACKGROUND OF THE INVENTION

1. Field of the Invention

The present invention relates to an electrostatic discharge (ESD) protection circuit, specifically, to an ESD protection circuit, which reduces the triggering voltage of a silicon controlled rectifier (SCR), to improves its performance.

2. Discussion of Related Art

The conductive layer or oxide layer of a semiconductor device may be thermally destructed by ESD. In order to reduce the device breakdown due to ESD, there are primary method of removing the cause of generation of ESD, which surrounds the device, and secondary method of performing sequential discharge without affecting the internal circuit of the device using an appropriate ESD protection circuit. Meantime, the SCR used as an ESD protection circuit has high efficiency in current-voltage characteristic, but its triggering voltage is high.

A conventional ESD protection circuit is explained below with reference to the attached drawings. FIG. 1 is a cross-sectional view of a conventional lateral silicon controlled rectifier (LSCR) of ESD protection circuit, and FIG. 2 is a cross-sectional view of a conventional modified lateral SCR (MLSCR) of ESD protection circuit. Referring to FIG. 1, the LSCR includes a semiconductor substrate 1, an N-well region 2 selectively formed in a predetermined region of semiconductor substrate 1, first and second impurity regions 3 and 4 formed in N-well region 2, and a third impurity region 5 formed in a predetermined portion of substrate 1 other than N-well region 2, the third impurity region 5 and N-well region 2 having an isolation layer therebetween.

Semiconductor substrate 1 is p-type, second impurity region 4 has the same conductivity as that of substrate 1, and first and third impurity regions 3 and 5 have a conductivity opposite to that of substrate 1. First and second impurity regions 3 and 4 are connected to an output pad, and third impurity region 5 is connected to Vss line. In the ESD protection circuit constructed as above, first and third impurity regions 3 and 5 form a horizontal NPN bipolar transistor, and second impurity region 2 forms a vertical PNP bipolar transistor. The NPN bipolar transistor and PNP bipolar transistor are latched with each other.

The operation of the LSCR ESD protection circuit is described below. When positive (+) voltage (static electricity) is applied through the pad, avalanche breakdown occurs between N-well region 2 and semiconductor substrate 1. Thus, current which flows through third impurity region 5 to Vss line is increased. The horizontal NPN bipolar transistor is turned on, and then the vertical PNP bipolar transistor is turned on to operate a parasitic thyristor. By doing so, the LSCR circuit is triggered.

However, the LSCR has very high triggering voltage. To solve this problem, the MLSCR is developed. Referring to FIG. 2, the MLSCR includes a semiconductor substrate 20, an N-well region 21 selectively formed in a predetermined region of semiconductor substrate 20, first and second impurity regions 22 and 23 formed in N-well region 21, a third impurity region 24 formed between N-well region 21 and semiconductor substrate 20, and a fourth impurity region 25 formed in a predetermined portion of substrate 1 other than N-well region 21, N-well region 21 and fourth impurity region 25 having an isolation layer therebetween.

Semiconductor substrate 20 is p-type, second impurity region 23 has the same conductivity as that of substrate 20, and first, third and fourth impurity regions 22, 24 and 25 have a conductivity opposite to that of substrate 20. First and second impurity regions 22 and 23 are connected to an output pad, fourth impurity region 25 is connected to Vss line, and third impurity region 24 corresponds to a trigger diffusion region. In this ESD protection circuit, first and fourth impurity regions 22 and 25 form a horizontal NPN bipolar transistor, and second impurity region 23 forms a vertical PNP bipolar transistor.

The operation of the MLSCR ESD protection circuit is described below. When positive (+) voltage (static electricity) is applied through the pad, avalanche breakdown occurs between N-well region 24 and semiconductor substrate 20. Thus, current which flows through fourth region 25 to Vss line increases. Since the horizontal NPN bipolar transistor is turned on, and then the vertical PNP bipolar transistor is turned on, the triggering voltage of MLSCR becomes lower than that of the LSCR by approximately 20V.

FIG. 3A shows the circuit configuration of a conventional LVTSCR ESD protection circuit, and FIG. 3B is a cross-sectional view of the conventional LVTSCR ESD protection circuit. Referring to FIG. 3A, the LVTSCR circuit includes: a first transistor 31 whose emitter is connected to Vss line, the collector of first transistor 31 being connected to an output pad; a second transistor 32 whose emitter is connected to the output pad, the collector of second transistor 32 being connected to the base of first transistor 31; an NMOS transistor 33 whose source is connected to the base of second transistor 32, the drain of NMOS transistor 33 being connected to the emitter of first transistor 31, the gate of NMOS transistor 33 being connected to Vss line, an N-well resistor 34 formed between the collector of first transistor 31 and output pad, and a substrate resistor 35 formed between the collector of second transistor 32 and emitter of first transistor 31. First transistor 31 is an NPN bipolar transistor, and second transistor 32 is a PNP bipolar transistor.

Referring to FIG. 3B, the LVTSCR includes a substrate 40, an N-well region 41 selectively formed in a predetermined portion of substrate 40, first and second impurity regions 42 and 43 formed in N-well region 41, a gate electrode 44 formed on a predetermined portion of substrate 40, having a gate oxide layer formed therebetween, and third and fourth impurity regions 45 and 46 formed in a predetermined region of substrate 40, placed on both sides of gate electrode 44.

Semiconductor substrate 40 is p-type, second impurity region 43 has the same conductivity as that of substrate 40, and first, third and fourth impurity regions 42, 45 and 46 have a conductivity opposite to that of substrate 40. First and second impurity regions 42 and 43 are connected to the output pad, and gate electrode 44 and fourth impurity region 46 are connected to Vss line. Third and fourth impurity regions 45 and 46, and gate electrode 44 form one MOS transistor, first and fourth impurity regions 42 and 46 form an NPN bipolar transistor, and second impurity region 43 forms a PNP bipolar transistor.

The operation of the conventional LVTSCR circuit is explained below. Referring to FIGS. 3A and 3B, when positive voltage (static electricity) is applied through the pad, breakdown occurs at the junction of N-well region 41 and semiconductor substrate 40. Accordingly, current which flows through fourth impurity region 46 to Vss line increases. This increases the voltage of N-well region 41, and thus the NPN bipolar transistor operates.

Referring to FIG. 3A, first transistor 31 is turned on to by-pass the positive voltage, applied to the pad, to the Vss line. When a supply voltage is not applied to the LVTSCR circuit, MOS transistor 33 is floated. That is, if the supply voltage is not applied, the supply power is not supplied to gate 44 of MOS transistor 33, thereby turning off MOS transistor 33. The turning off of MOS transistor 33 makes the resistance of the circuit very high. Accordingly, the triggering voltage of LVTSCR becomes lower than that of MLSCR by approximately 13V. However, the conventional ESD protection circuit has the following problem. The integration in semiconductor chips reduces the thickness of gate oxide layer, so that an ESD protection circuit having lower triggering voltage is required. Accordingly, when the triggering voltage of ESD protection circuit is larger than the breakdown voltage of gate oxide layer, the gate oxide layer placed in the internal circuit of semiconductor chip is damaged when the ESD protection circuit operates.

SUMMARY OF THE INVENTION

Accordingly, the present invention is directed to an ESD protection circuit that substantially obviates one or more of the problems due to limitations and disadvantages of the related art.

An object of the present invention is to provide an ESD protection circuit, which reduces its triggering voltage using a control gate and floating gate, to maximize the efficiency in ESD protection.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the ESD protection circuit includes: a second conductivity of well formed in a predetermined portion of a first conductivity of semiconductor substrate; a first conductivity of first impurity region and second conductivity of second impurity region, formed in the second conductivity of well; a first gate electrode formed on the semiconductor substrate, and second gate electrode formed on the first gate electrode, the first gate electrode being isolated from the semiconductor substrate; second conductivity of third and fourth impurity regions, formed in a portion of the semiconductor substrate, the portion being placed on both sides of the first and second gate electrodes; and a second conductivity of fifth impurity region formed on the semiconductor substrate, the fourth and fifth impurity regions having an isolation layer therebetween.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF PREFERRED EMBODIMENT

Reference will now be made in detail to the preferred embodiments of the present invention, examples of which are illustrated in the accompanying drawings.

Figure 1:
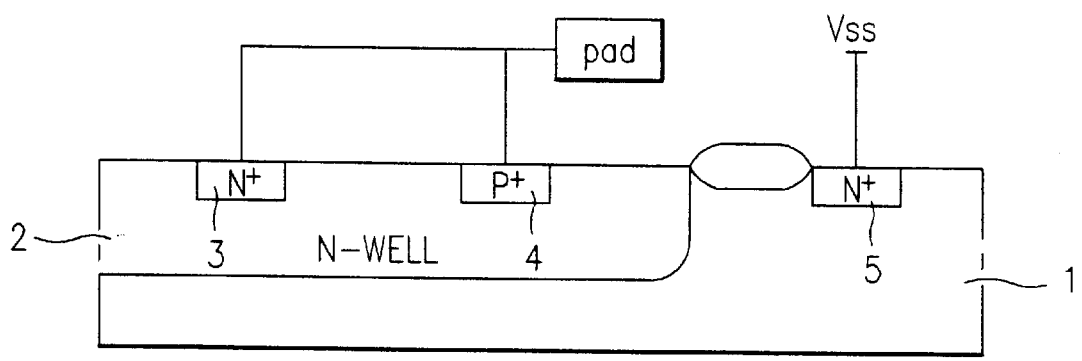
FIG. 1 is a cross-sectional view of a conventional LSCR ESD protection circuit.
Figure 2:
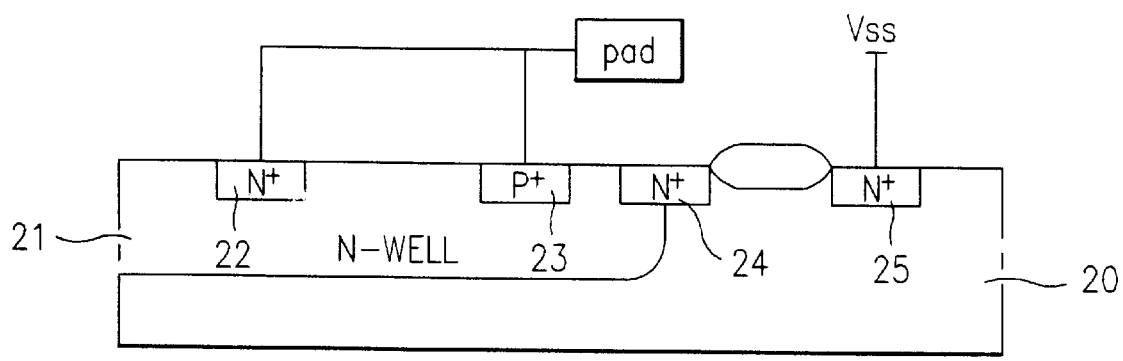
FIG. 2 is a cross-sectional view of a conventional MLSCR ESD protection circuit.
Figure 3A:
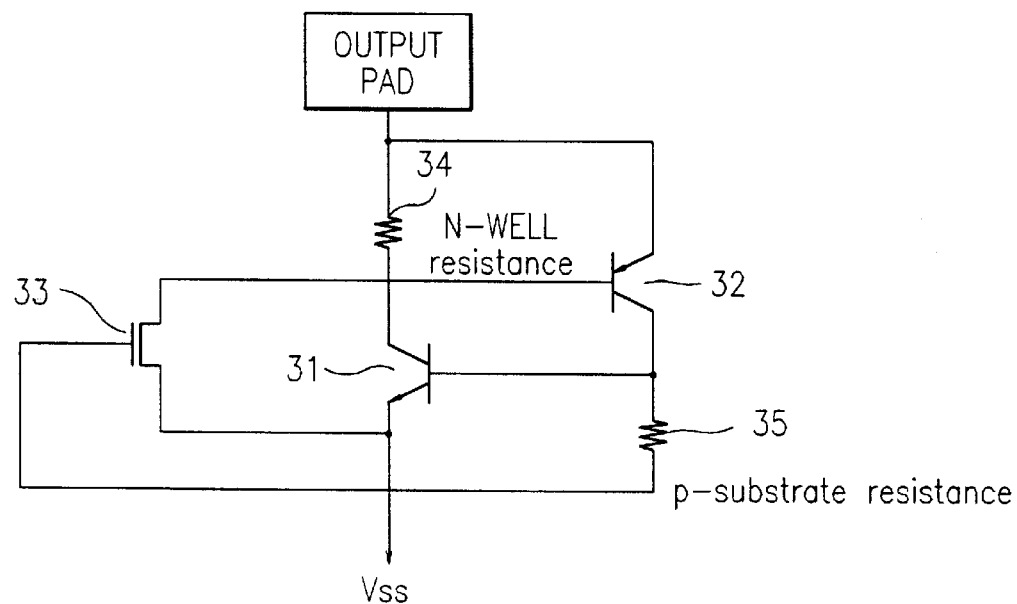
FIG. 3A shows the circuit configuration of a conventional LVTSCR ESD protection circuit.
Figure 3B:
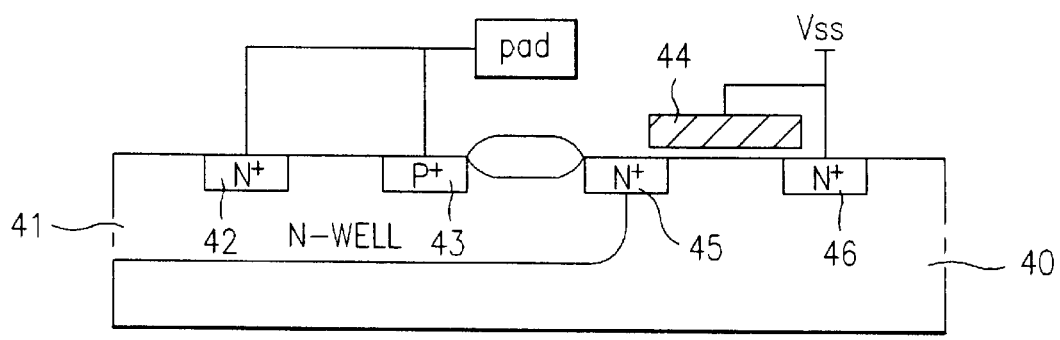
FIG. 3B is a cross-sectional view of a conventional LVTSCR ESD protection circuit.
Figure 4A:
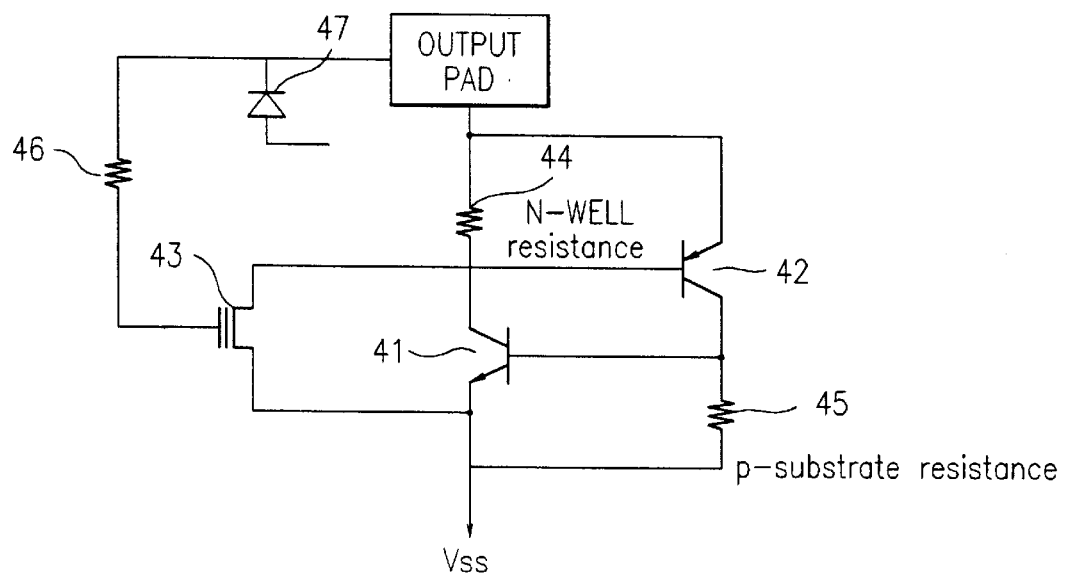
FIG. 4A shows the circuit configuration of a control gate SCR ESD protection circuit according to the present invention.
Figure 4B:
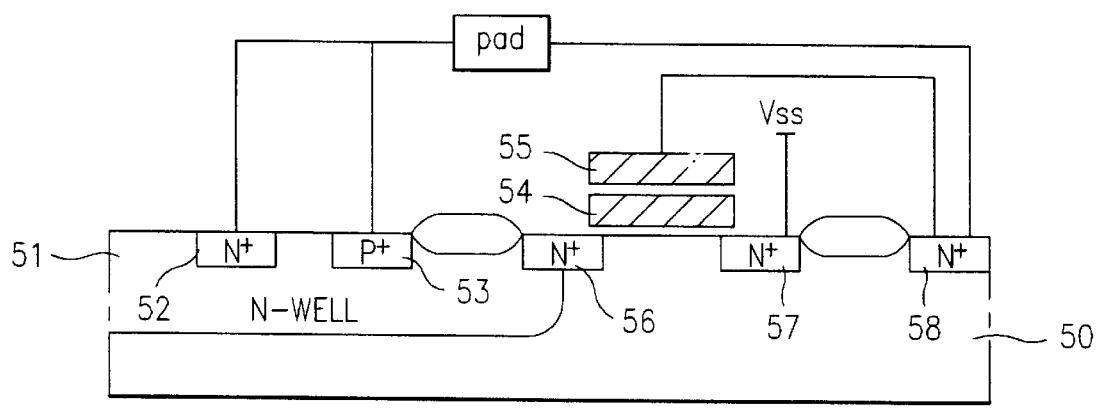
FIG. 4B is a cross-sectional view of the control gate SCR ESD protection circuit according to the present invention.

FIG. 4A shows the circuit configuration of a control gate SCR ESD protection circuit according to the present invention, and FIG. 4B is a cross-sectional view of the control gate SCR ESD protection circuit according to the present invention. Referring to FIG. 4A, the control gate SCR circuit includes: a first transistor 41 whose collector is connected to an output pad, the emitter of first transistor 41 being connected to Vss line; a second transistor 42 whose collector is connected to the base of first transistor 41, the emitter of second transistor 42 being connected to the output pad; a MOS transistor 43 whose source is connected to the base of second transistor 42, the drain of MOS transistor 43 being connected to the emitter of first transistor 41, the control gate of MOS transistor 43 being connected to the output pad; an N-well resistor 44 formed between the collector of first transistor 41 and output pad; a substrate resistor 45 formed between the collector of second transistor 42 and emitter of first transistor 41; an impurity resistor 46 formed between the control gate of MOS transistor and output pad; and a diode 47 formed between impurity resistor 46 and output pad. First transistor 41 is an NPN bipolar transistor, and second transistor 42 is a PNP bipolar transistor.

Referring to FIG. 4B, the circuit includes: a substrate 50; an N-well region 51 selectively formed in a predetermined portion of substrate 50; first and second impurity regions 52 and 53 formed in N-well region 51; a floating gate electrode 54 formed on a predetermined region of substrate 50, having a gate oxide layer formed therebetween; a control gate electrode 55 formed on floating gate electrode 54, having an insulating layer therebetween; third and fourth impurity regions 56 and 57 formed in a portion of substrate 50, placed on both sides of floating gate electrode 54; and a fifth impurity region 58 formed in a predetermined portion of substrate 50 other than N-well region 51, fifth impurity region 58 and fourth impurity region 57 having an isolation layer formed therebetween.

Third impurity region 56 is formed at the boundary between N-well region 51 and semiconductor substrate 50, and an isolation layer is formed between second impurity region 53 and third impurity region 56. Semiconductor substrate 50 is p-type, second impurity region 53 has the same conductivity as that of substrate 50, and first, third, fourth and fifth impurity regions have a conductivity opposite to substrate 50. First and second impurity regions 52 and 53 are connected to the output pad, control gate electrode 55 is connected to the output pad through fifth impurity region 58, and fourth impurity region 57 is connected to Vss line.

In the ESD protection circuit of the present invention, third and fourth impurity regions 56 and 57, floating gate electrode 54 and control gate electrode 55 form one MOS transistor, first and fourth impurity regions 52 and 57 form an NPN bipolar transistor, and second impurity region 53 forms a PNP bipolar transistor. A first capacitor C1 exists between semiconductor substrate 50 and floating gate electrode 54, and second capacitor C2 exists between floating gate electrode 54 and control gate electrode 55. Second capacitor C2 has the capacity larger than that of first capacitor C1.

The operation of the control gate SCR circuit of the present invention is explained below. Referring to FIGS. 4A and 4B, when positive voltage (static electricity) is applied through the pad, breakdown occurs at the junction between N-well region 51 and semiconductor substrate 50. Accordingly, N-well current which flows through fourth impurity region 57 to Vss line increases, and thus the voltage of N-well region 51 becomes higher, thereby operating the NPN bipolar transistor. Furthermore, a pulse is applied to control gate electrode 56 through fifth impurity region 58. Here, when the voltage applied to control gate electrode 56 is called Vug, voltage applied to floating gate electrode 55 becomes C1/(C1+C2)×Vug.

The potential applied to floating gate electrode 55 can be controlled by first and second capacitors C1 and C2. Here, since the value of first capacitor C1 is fixed as gate oxide capacitance, the potential can be adjusted by varying the capacitance of second capacitor C2. As a result, the voltage applied to floating gate electrode 55 allows the turn-on time of MOS transistor 43 to be reduced, to give rise to SCR operation rapidly, because floating gate electrode 54 is being floated. Accordingly, the triggering voltage of the circuit can be decreased. If negative voltage (static electricity) is applied, diode 47 between fifth impurity region 58 and semiconductor substrate 50 operates to drive the field oxide device of fourth and fifth impurity regions 57 and 58, thereby forming a discharge path. The field plate diode of MOS transistor 43 also operates.

As described above, according to the present invention, the control gate SCR circuit can be used as ESD protection circuit without employing a separate circuit because its triggering voltage can be reduced using the control gate and floating gate. Furthermore, the junction size is increased, to improve the negative ESD characteristic.

It will be apparent to those skilled in the art that various modifications and variations can be made in the ESD protection circuit of the present invention without departing from the spirit or scope of the invention. Thus, it is intended that the present invention cover the modifications and variations of this invention provided they come within the scope of the appended claims and their equivalents.

What is claimed is:

1. An ESD protection circuit comprising:
    a second conductivity of well formed in a predetermined portion of a first conductivity of semiconductor substrate;
    a first conductivity of first impurity region and second conductivity of second impurity region, formed in the second conductivity of well;
    a first gate electrode formed on the semiconductor substrate, and second gate electrode formed on the first gate electrode, the first gate electrode being isolated from the semiconductor substrate;
    second conductivity of third and fourth impurity regions, formed in a portion of the semiconductor substrate, the portion being placed on both sides of the first and second gate electrodes; and
    a second conductivity of fifth impurity region formed on the semiconductor substrate, the fourth and fifth impurity regions having an isolation layer therebetween.

2. The ESD protection circuit as claimed in claim 1, wherein the first conductivity is p-type, and second conductivity is N-type.

3. The ESD protection circuit as claimed in claim 1, wherein the third impurity region is formed at the boundary between the semiconductor substrate and second conductivity of well, the third impurity region and first impurity region having an isolation layer therebetween.

4. The ESD protection circuit as claimed in claim 1, wherein the first gate electrode is used as floating gate, and second gate electrode is used as control gate.

5. The ESD protection circuit as claimed in claim 1, wherein the capacitance between the first and second gate electrodes is controllable.

6. The ESD protection circuit as claimed in claim 1, wherein the first, second gate electrodes, third and fourth impurity regions, which are formed on both sides of first and gate electrodes, form a transistor.

7. The ESD protection circuit as claimed in claim 1, wherein the first, second and fourth impunity regions form a bipolar transistor.

* * * * *